United States Patent
Pratt et al.

(10) Patent No.: US 9,245,844 B2
(45) Date of Patent: Jan. 26, 2016

(54) PITCH-HALVING INTEGRATED CIRCUIT PROCESS AND INTEGRATED CIRCUIT STRUCTURE MADE THEREBY

(71) Applicants: David Storrs Pratt, Meridian, ID (US); Richard Housley, Boise, ID (US)

(72) Inventors: David Storrs Pratt, Meridian, ID (US); Richard Housley, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 190 days.

(21) Appl. No.: 13/845,038

(22) Filed: Mar. 17, 2013

(65) Prior Publication Data

US 2014/0264893 A1 Sep. 18, 2014

(51) Int. Cl.
| | |
|---|---|
| *H01L 21/768* | (2006.01) |
| *H01L 23/528* | (2006.01) |
| *H01L 21/033* | (2006.01) |
| *H01L 21/3213* | (2006.01) |
| *H01L 27/108* | (2006.01) |

(52) U.S. Cl.
CPC .......... *H01L 23/528* (2013.01); *H01L 21/0337* (2013.01); *H01L 21/32139* (2013.01); *H01L 27/10891* (2013.01); *H01L 2924/0002* (2013.01)

(58) Field of Classification Search
CPC ............ H01L 21/76892; H01L 23/528; H01L 27/10891; H01L 21/0337; H01L 21/0338; H01L 21/3086; H01L 21/31144; H01L 21/32139; H01L 21/76816; H01L 21/76224

USPC .................. 257/773, 774, 776, 786, E21.036, 257/E21.585; 438/762, 671, 694, 672
See application file for complete search history.

(56) References Cited

U.S. PATENT DOCUMENTS

| | | | |
|---|---|---|---|
| 7,989,355 B2 | 8/2011 | Shieh et al. | |
| 8,222,140 B2 * | 7/2012 | Tang et al. | 438/671 |
| 2008/0017997 A1 * | 1/2008 | Yoon et al. | 257/786 |
| 2011/0151668 A1 * | 6/2011 | Tang et al. | 438/671 |
| 2012/0032336 A1 * | 2/2012 | Lin | 257/773 |
| 2013/0307166 A1 * | 11/2013 | Doebler et al. | 257/786 |

OTHER PUBLICATIONS

"Office Action of Taiwan Counterpart Application," issued on Nov. 10, 2015, p. 1-3.

* cited by examiner

*Primary Examiner* — Thinh T Nguyen
(74) *Attorney, Agent, or Firm* — Jianq Chyun IP Office

(57) ABSTRACT

A pitch-halving IC process is described. Parallel base line patterns are formed over a substrate, each being connected with a hammerhead pattern at a first or second side of the base line patterns, wherein the hammerhead patterns are arranged at the first side and the second side alternately, and the hammerhead patterns at the first or second side are arranged in a staggered manner. The above patterns are trimmed. A spacer is formed on the sidewalls of each base line pattern and the corresponding hammerhead pattern, including a pair of derivative line patterns, a loop pattern around the hammerhead pattern, and a turning pattern at the other end of the base line pattern. The base line patterns and the hammerhead patterns are removed. A portion of each loop pattern and at least a portion of each turning pattern are removed to disconnect each pair of derivative line patterns.

6 Claims, 2 Drawing Sheets

PITCH-HALVING INTEGRATED CIRCUIT PROCESS AND INTEGRATED CIRCUIT STRUCTURE MADE THEREBY

BACKGROUND OF THE INVENTION

1. Field of Invention

This invention relates to integrated circuit (IC) fabrication, and particularly to a pitch-halving IC process and an IC structure made by the same process.

2. Description of Related Art

The resolution in a photolithography process depends on the wavelength of the exposure light, the numerical aperture (NA) of the optical system and the design of the photomask, and has a certain limit according to the exposure conditions. When the resolution required by an array of patterns exceeds the resolution of the lithographic system, for example, in a case of forming the gate line array of a high-density memory like a DRAM of next generation, a pitch reduction method is needed, mainly based on the spacer forming technique.

For example, patterns of dense conductive lines beyond lithographic resolution can be formed as follows. Parallel base line patterns are lithographically defined and trimmed, linear spacers having a smaller width/pitch and a double number are formed on the sidewalls of the base line patterns, and then the base line patterns are removed, leaving the linear spacers as the target line patterns beyond the lithographic resolution.

However, the contact pads of such small-pitch conductive lines are difficult to form at the line ends, due to their larger width for sufficient electrical contact.

SUMMARY OF THE INVENTION

In view of the foregoing, this invention provides a pitch-halving IC process, which is particularly suitable for definition and formation of dense conductive lines beyond the lithographic resolution and their contact pads.

This invention also provides an IC structure that is made by the pitch-halving IC process of this invention.

The pitch-halving IC process of this invention is described as follows. A plurality of parallel base line patterns is formed over a substrate, each being connected with a hammerhead pattern at a first side or a second side of the plurality of base line patterns, wherein the hammerhead patterns are arranged at the first side and the second side alternately, and the hammerhead patterns at the first or second side are arranged in a staggered manner. Each base line pattern and each hammerhead pattern are trimmed. A spacer is then formed on the sidewalls of each base line pattern and the corresponding hammerhead pattern, including a pair of derivative line patterns, a loop pattern around the hammerhead pattern, and a turning pattern at an end of the base line pattern without the corresponding hammerhead pattern. The base line patterns and the hammerhead patterns are then removed. A portion of each loop pattern and at least a portion of each turning pattern are removed to disconnect each pair of derivative line patterns, wherein the remaining loop pattern includes two contact pad patterns.

In an exemplary embodiment, the above process further includes transferring the patterns of the derivative line patterns and the remaining loop patterns to an underlying conductive layer. The patterned underlying conductive layer includes: a plurality of conductive lines corresponding to the derivative line patterns, and a plurality of contact pads corresponding to the remaining loop patterns. In another exemplary embodiment, the derivative line patterns and the remaining loop patterns are directly conductive lines and their contact pads, respectively.

In addition, the pitch-halving IC process of this invention may further include forming a plurality of contact plugs over the contact pads.

The IC structure includes of this invention a plurality of parallel conductive lines and their contact pads. The conductive lines are arranged in a plurality of pairs. Each contact pad is connected with a conductive line at one end thereof, wherein the two contact pads of each pair of conductive lines form an opened loop, the opened loops are arranged at a first side and a second side of the plurality of conductive lines alternately, and the opened loops at the first or second side are arranged in a staggered manner.

The above IC structure may further comprise a plurality of contact plugs over the contact pads.

By arranging the hammerhead patterns at the same side of the base line patterns in a staggered manner and utilizing the loop patterns formed as spacers around the hammerhead patterns to form the contact pad patterns, this invention allows the contact pads of the dense conductive lines to be formed with a sufficient distance between each other as well as in a high die-area utilization efficiency.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention. For example, though the outer hammerhead patterns at the first side and the second side of the plurality of base line patterns have the same dimension as the inner ones in the direction perpendicular to the line, they can alternatively have a greater dimension in the perpendicular direction, as long as a sufficient distance can be provided between the two loop patterns formed around any two neighboring outer hammerhead patterns to make a sufficient distance between the two neighboring contact plugs that will be defined from the two loop patterns latter.

FIGS. 1, 2, 3 and 4 illustrate, in a top view, a pitch-halving IC process according to an embodiment of this invention, and FIGS. 1A, 2A, 3A and 4A respectively illustrate, in a cross-sectional view along the line A-A', the structures illustrated in FIGS. 1, 2, 3 and 4, respectively.

Figure 1:
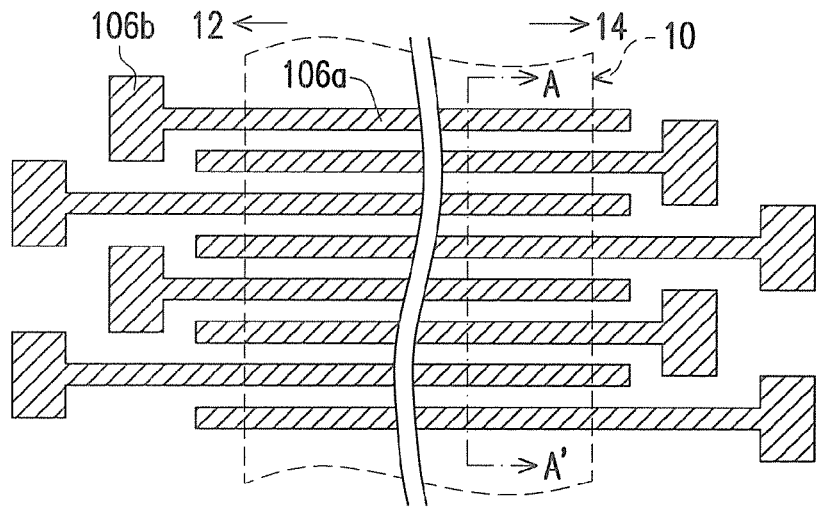
FIGS. 1, 2, 3 and 4 illustrate, in a top view, a pitch-halving IC process according to an embodiment of this invention, wherein FIG. 4 also illustrates an IC structure according to the embodiment.
Figure 1A:
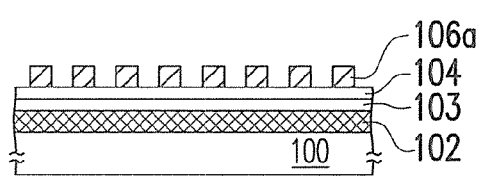
FIGS. 1A, 2A, 3A and 4A respectively illustrate, in a cross-sectional view along the line A-A', the structures illustrated in FIGS. 1, 2, 3 and 4, respectively.

Referring to FIGS. 1 and 1A, a conductive layer 102, an etching mask layer 103, an anti-reflection coating (ARC) 104, and a patterned photoresist layer 106a+b of positive or negative type are formed over a substrate 100 in sequence. The conductive layer 102 may include doped poly-Si, metal or a combination thereof. The etching mask layer 103 may include a carbon layer. The substrate 100 as provided may have been formed with other material layer. For example, in a case where the conductive layer 102 is to be defined into gate lines, the substrate has been formed with a gate dielectric layer, such as a gate oxide layer or a high-k layer, before the conductive layer 102 is formed. The patterned photoresist layer 106a+b is defined by a lithography process.

The patterned photoresist layer includes a plurality of parallel base line patterns 106a, each of which is connected with a hammerhead pattern 106b at a first side 12 or a second side 14 of the plurality of base line patterns 106a. The hammerhead patterns 106b are arranged at the first side 12 and the second side 14 alternately, while the hammerhead patterns 106b at the first side 12 or the second side 14 are arranged in a staggered manner. In addition, when the process of this invention is applied to form half-pitch conductive lines of a high-density memory array, there is an array area 10 on the substrate 100, in which almost the entirety of each base line pattern 106a is located. The high-density memory array may be a high-density DRAM array.

It is noted that though the hammerhead patterns 106b at the first side 12 or the second side 14 as illustrated herein include only inner and outer sets of hammerhead patterns that are arranged in a 2-tiered manner, this invention is not limited thereto. The hammerhead patterns 106b at each side may alternatively include multiple levels or multiple tiers of staggered hammerhead patterns, such as 3 or 4 levels of staggered hammerhead patterns.

Though the base line patterns 106a and the hammerhead patterns 106b include a photoresist material and are defined by a lithography process in the above case, the base line patterns and hammerhead patterns formed in this invention are not limited thereto. They may alternatively include other material that can be trimmed narrowed, such as a suitable hard mask material, e.g., $SiO_x$, $Si_3N_4$, carbon or poly-Si, etc. In such a case, the base line patterns and hammerhead patterns are defined by a patterned photoresist layer (not shown), and no anti-reflection coating is required under the unpatterned layer (not shown) from which the base line and hammerhead patterns are defined.

Figure 2A:
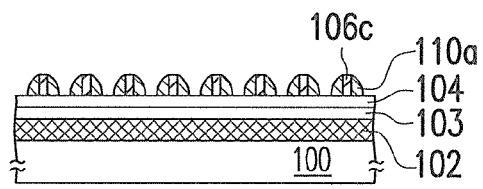
Figure 2:
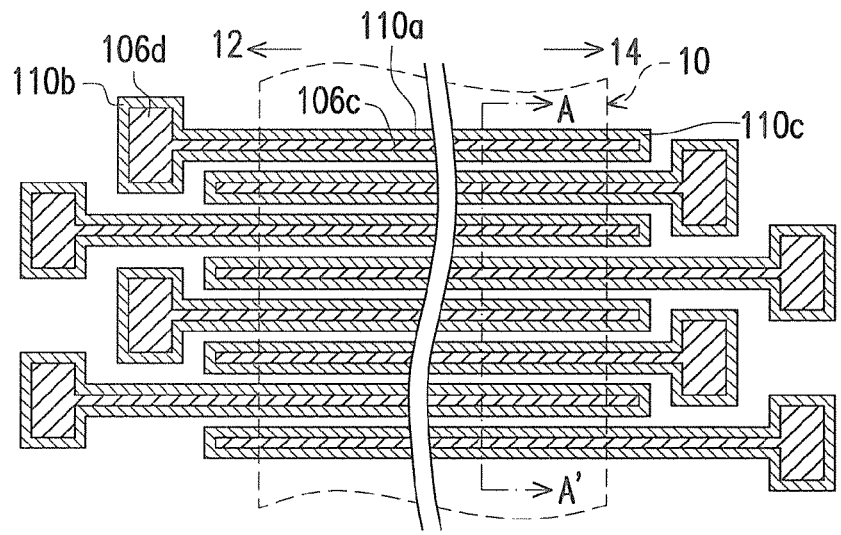

Referring to FIGS. 2 and 2A, each of the base line patterns 106a and each of the hammerhead patterns 106b are trimmed to be narrower. When the base line patterns 106a and the hammerhead patterns 106b include a photoresist material, the trimming may utilize a dry etching process.

Thereafter, a spacer 110a+b+c is formed on the sidewalls of each trimmed base line pattern 106c and the corresponding trimmed hammerhead pattern 106d, including a pair of derivative line patterns 110a, a loop pattern 110b around the trimmed hammerhead pattern 106d, and a turning pattern 110c at the end of the trimmed base line pattern 106c without the corresponding trimmed hammerhead pattern 106d. The spacers are usually formed by depositing a substantially conformal material layer on the trimmed (photoresist) patterns 106c and 106d and the exposed portions of the ARC 104 and then anisotropically etching the same, such that only the portions of the material layer on the vertical sidewalls of the trimmed patterns 106c and 106d remain but the portions of the same on the horizontal surfaces are removed, wherein the material layer may include silicon oxide. The width of each spacer or derivative line pattern 110a is controlled by the deposition thickness. The spacers may include low-temperature oxide (LTO) or ALD (atomic layer deposition) oxide when the base line patterns 106a and the hammerhead patterns 106b include a photoresist material. When the base line patterns and the hammerhead patterns include a hard mask material, the spacers may include another material that can have a much lower removal rate than the hard mask material, such as $SiO_x$, $Si_3N_4$, carbon or poly-Si.

Figure 3:
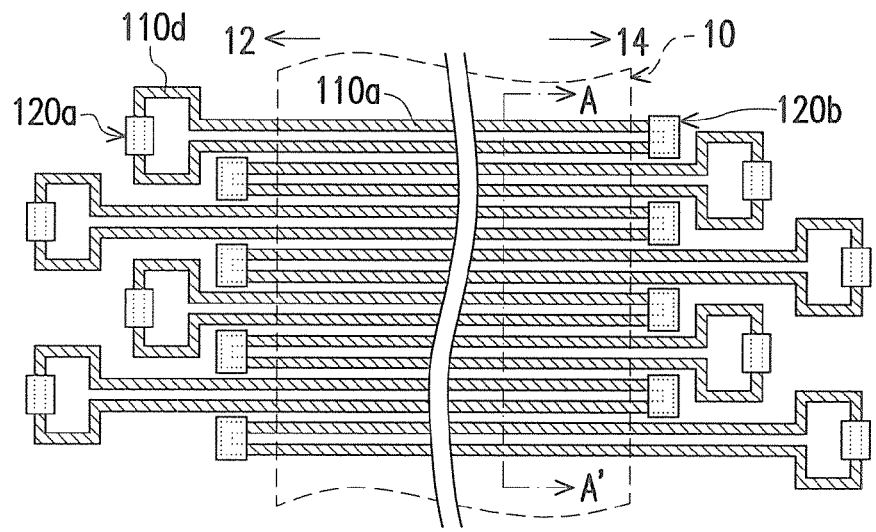
Figures 3A, 4A:
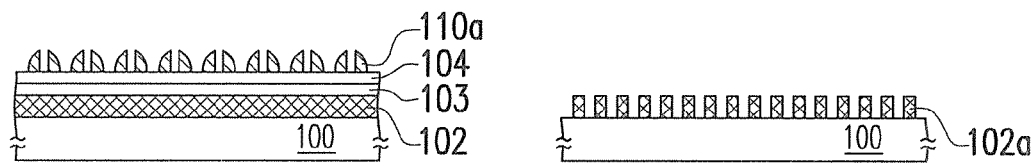

Referring to FIGS. 3 and 3A, all of the trimmed base line patterns 106c and the trimmed hammerhead patterns 106d are removed, possibly by using $O_2$-plasma ashing or solvent stripping, leaving the derivative line patterns 110a, the loop patterns 110b and the turning patterns 110c (FIG. 2). For example, when the base line patterns 106a and the hammerhead patterns 106b include a photoresist material and the spacers include LTO, oxygen plasma can be used to remove the trimmed base line patterns 106c and the trimmed hammerhead patterns 106d.

Thereafter, each turning pattern 110c and a portion of each loop pattern 110b are removed to disconnect each pair of derivative line patterns 110a, such that each remaining loop pattern 110d includes two contact pad patterns. The removed portions of the loop patterns 110b and the removal of the turning patterns 110c can be defined by chop openings 120a and 120b, respectively. The chop openings 120a and 120b are lithographically formed in a mask layer, such as a photoresist layer.

In addition, though each turning pattern 110c is entirely removed in the above case, it is feasible to remove just a portion of each turning pattern 110c as long as the connection between the corresponding pair of derivative line patterns 110a is broken.

Figure 4:
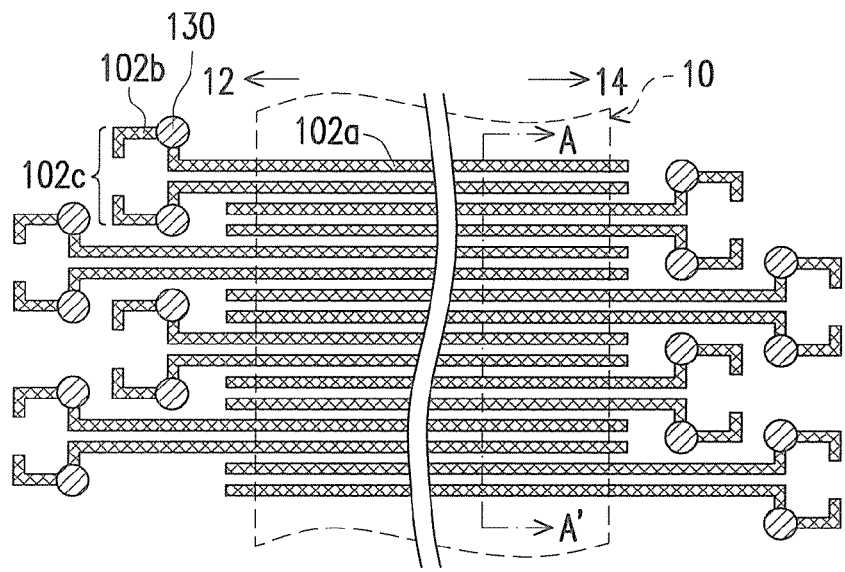

Referring to FIGS. 4 and 4A, after the patterned mask layer having the chop openings 120a and 120b therein is removed, the patterns of the derivative line patterns 110a and the remaining loop patterns 110d are transferred to the underlying etching mask layer 103 and then to the underlying conductive layer 102, basically by etching the etching mask layer 103 and the conductive layer 102 with the derivative line patterns 110a and the remaining loop patterns 110d as a mask. The remaining etching mask layer 103 that serves as an etching mask during the final etching stage is then removed or stripped away to leave only the patterned conductive layer 102. The patterned conductive layer 102 includes a plurality of conductive lines 102a corresponding to the derivative line patterns 110a, and a plurality of contact pads 102b corresponding to the remaining loop patterns 110d. The conductive lines 102a may serve as a plurality of conductive lines of a memory array, such as the word lines of a memory array. The memory array may be a DRAM array.

Then, a plurality of contact plugs 130 are formed over the contact pads 102b, wherein each contact plug 130 is formed over a contact pad 102b. The contact plugs 130 may include a metal, such as tungsten (W).

Though the derivative line patterns 110a and the remaining loop patterns 110d are formed for defining an underlying conductive layer 102 into half-pitch conductive lines and their contact pads in the above case, this invention is not limited thereto. It is also possible to omit an underlying conductive layer, choose a suitable material for the base line and hammerhead patterns, and form a conductive spacer, such as a metal (e.g., TiN) spacer, on the sidewalls of each trimmed base line pattern and the corresponding trimmed hammerhead pattern, including a pair of conductive derivative lines and a conductive loop pattern. Thus, after the trimmed base line patterns and the trimmed hammerhead patterned are all removed and each conductive loop pattern is partially removed through an aforementioned chop opening, the derivative lines and the opened loop patterns can directly serve as conductive lines and their contact pads.

On other hand, when the original base line patterns 106a have a line/space (L/S) width of $F_1/F_1$, each trimmed base line pattern 106c has a feature size $F_2$, each derivative line pattern 110a also has a feature size of $F_2$, and $F_2=0.5\ F_1$, the derivative line patterns 110a have a constant pitch of $2F_2 (=F_1)$. In an embodiment, $F_1$ is the lithography-limit feature size, $F_2=0.5 F_1$, the original base line patterns 106a have an L/S width of $F_1/F_1$ substantially, the trimmed base line patterns 106c have an L/S width of $F_2/3F_2$ substantially, the derivative line patterns 110a have an L/S width of $F_2/F_2$ substantially, so that a maximal density of the derivative line patterns 110a with a constant pitch of $2F_2$ are formed.

FIG. 4 also illustrates an IC structure according to the above embodiment of this invention. The structure includes a plurality of parallel conductive lines 102a arranged in a plurality of pairs, and a plurality of contact pads 102b. Each contact pad 102b is connected with a conductive line 102a at one end of the conductive line 102a, wherein the two contact pads 102b of each pair of conductive lines 102a form an opened loop 102c. The opened loops 102c are arranged at a first side 12 and a second side 14 of the plurality of conductive lines 102a alternately, and the opened loops 102c at the first side 12 or the second side 14 are arranged in a staggered manner.

The conductive lines 102a may have an L/S width of 0.5 F/0.5 F substantially, wherein F is the lithography-limited feature size. Such conductive lines 102a may serve as dense conductive lines of a high-density memory array, such as dense word lines of a high-density memory array. The memory array may be a DRAM array.

As described above, by arranging the hammerhead patterns at the same side of the base line patterns in a staggered manner and utilizing the loop patterns formed as spacers around the hammerhead patterns to form the contact pad patterns, this invention allows the contact pads of the dense conductive lines to be formed with a sufficient distance between each other as well as in a high die-area utilization efficiency. This allows larger contacts to be defined while lowering the risk of shorting to an adjacent contact or corresponding landing pad. It is well known that defining larger contacts is easier than defining smaller contacts.

The method of this invention also allows for more overlay or registration error between the contact layer and the underlying word line layer, as explained above.

This invention has been disclosed above in the preferred embodiments, but not limited to those. It is known to persons skilled in the art that some modifications and innovations may be made without departing from the spirit and scope of this invention. Hence, the scope of this invention should be defined by the following claims.

What is claimed is:

1. An integrated circuit (IC) structure, comprising:
a plurality of parallel conductive lines, arranged in a plurality of pairs;
a plurality of contact pads, each of which is connected with a conductive line at one end of the conductive line, wherein the two contact pads of each pair of conductive lines form an opened loop, the opened loops are arranged at a first side and a second side of the plurality of conductive lines alternately, and the opened loops at the first or second side are arranged in a staggered manner.

2. The IC structure of claim 1, further comprising a plurality of contact plugs over the contact pads.

3. The IC structure of claim 1, wherein the conductive lines have an L/S width of 0.5 F/0.5 F substantially, and F is a lithography-limited feature size.

4. The IC structure of claim 1, wherein the conductive lines comprise a plurality of conductive lines of a memory array.

5. The IC structure of claim 4, wherein the memory array comprises a DRAM array.

6. The IC structure of claim 4, wherein the conductive lines comprise a plurality of word lines of the memory array.

* * * * *